US009835648B2

(12) United States Patent
Baskaran et al.

(10) Patent No.: US 9,835,648 B2
(45) Date of Patent: Dec. 5, 2017

(54) LIQUID METAL INTERCONNECTS

(75) Inventors: Rajashree Baskaran, Seattle, WA (US); Kimin Jun, Hillsboro, OR (US); Ting Zhong, Tigard, OR (US); Roy E. Swart, Hillsboro, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1095 days.

(21) Appl. No.: 13/173,933

(22) Filed: Jun. 30, 2011

(65) Prior Publication Data
US 2013/0000117 A1    Jan. 3, 2013

(51) Int. Cl.
*G01R 31/28* (2006.01)
*G01R 1/04* (2006.01)
*H01R 3/08* (2006.01)
*G01R 1/067* (2006.01)

(52) U.S. Cl.
CPC ........ *G01R 1/0416* (2013.01); *G01R 1/06783* (2013.01); *H01R 3/08* (2013.01); *Y10T 29/49204* (2015.01)

(58) Field of Classification Search
CPC .... G01R 3/00; G01R 1/0416; G01R 1/06783; G01R 3/08; H05K 13/00
USPC ......... 29/874, 884, 825, 829, 842, 846, 851, 29/705, 747; 438/14–18; 174/257
See application file for complete search history.

(56) References Cited

U.S. PATENT DOCUMENTS

| | | | | |
|---|---|---|---|---|
| 5,170,930 A | * | 12/1992 | Dolbear | H01B 1/02 228/123.1 |
| 5,794,330 A | * | 8/1998 | Distefano | H01L 21/486 228/180.22 |
| 5,838,568 A | * | 11/1998 | Dickinson | G01R 31/30 700/121 |
| 5,969,534 A | * | 10/1999 | Hubner | G01R 1/06783 324/754.04 |
| 6,339,120 B1 | * | 1/2002 | Misra | H01L 23/3736 257/E23.107 |
| 6,710,369 B1 | * | 3/2004 | Travis | G01R 1/0466 257/48 |

(Continued)

OTHER PUBLICATIONS

Baldwin, D.S., Deshmukh, R.D., Hau, C.S., "Gallium Alloy Interconnects for Flip-Chip Assembly Applications," IEEE Transactions on Components and Packaging Technologies, Jun. 2000, 360-366, vol. 23, No. 2.

(Continued)

*Primary Examiner* — Peter DungBa Vo
*Assistant Examiner* — Kaying Kue
(74) *Attorney, Agent, or Firm* — Schwabe Williamson & Wyatt P.C.

(57) ABSTRACT

Embodiments of the invention provide methods for forming electrical connections using liquid metals. Electrical connections that employ liquid metals are useful for testing and validation of semiconductor devices. Electrical connections are formed between the probes of a testing interface and the electronic interface of a device under test through a liquid metal region. In embodiments of the invention, liquid metal interconnects are comprised of gallium or liquid metal alloys of gallium. The use of liquid metal contacts does not require a predetermined amount of force be applied in order to reliably make an electrical connection.

13 Claims, 4 Drawing Sheets

(56) References Cited

U.S. PATENT DOCUMENTS

| | | | |
|---|---|---|---|
| 6,881,609 B2* | 4/2005 | Salmon | H01L 23/49811 257/E23.068 |
| 6,927,471 B2* | 8/2005 | Salmon | H01L 23/49811 257/499 |
| 7,163,830 B2* | 1/2007 | Salmon | H01L 23/49811 257/778 |
| 7,427,809 B2* | 9/2008 | Salmon | H01L 21/4853 257/719 |
| 7,557,485 B1* | 7/2009 | Lynch | H01R 39/30 310/219 |
| 7,586,747 B2* | 9/2009 | Salmon | G02B 6/43 165/80.4 |
| 2005/0015967 A1* | 1/2005 | Su | G01R 31/2812 29/593 |
| 2005/0255722 A1* | 11/2005 | Salmon | H01L 23/057 439/67 |
| 2006/0079009 A1* | 4/2006 | Salmon | G01R 1/0483 438/14 |
| 2006/0131728 A1* | 6/2006 | Salmon | H01L 21/4853 257/698 |
| 2006/0145715 A1* | 7/2006 | Salmon | G01R 1/07357 324/750.06 |
| 2006/0153736 A1* | 7/2006 | Kalra | B01L 3/508 422/400 |
| 2007/0033989 A1* | 2/2007 | Armentrout | G01N 27/205 73/52 |
| 2008/0191729 A1* | 8/2008 | Blanco | G01R 31/2874 324/750.08 |
| 2010/0255318 A1* | 10/2010 | Fukatani | B32B 17/10036 428/427 |

OTHER PUBLICATIONS

Baldwin, D.S., Deshmukh, R.D., Hau, C.S., "Gallium Alloy Interconnects for Flip-Chip Assembly Applications," Electronic Components and Technology Conference, 1996, 1143-1150.

* cited by examiner

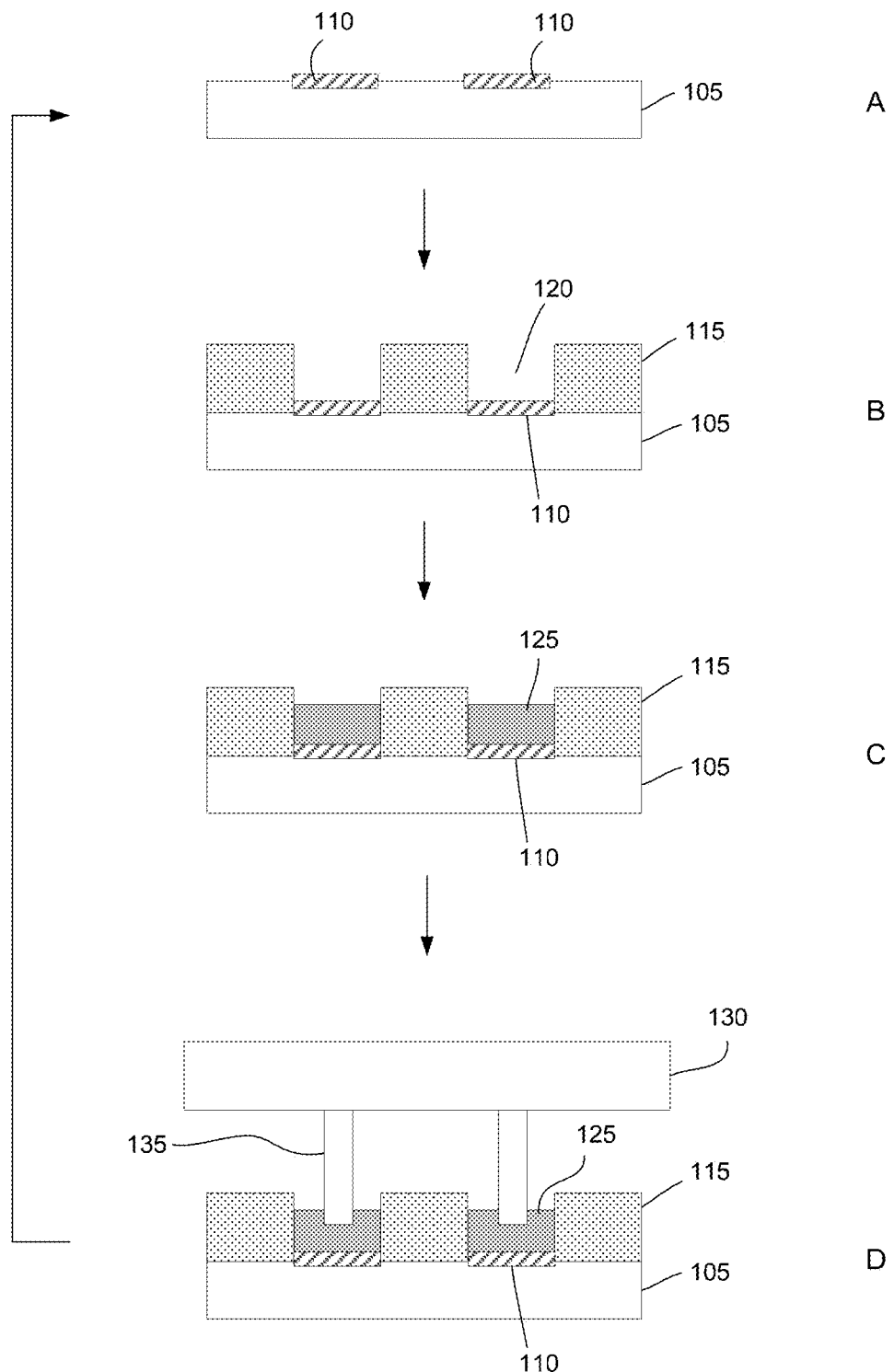
FIGURE 1A-D

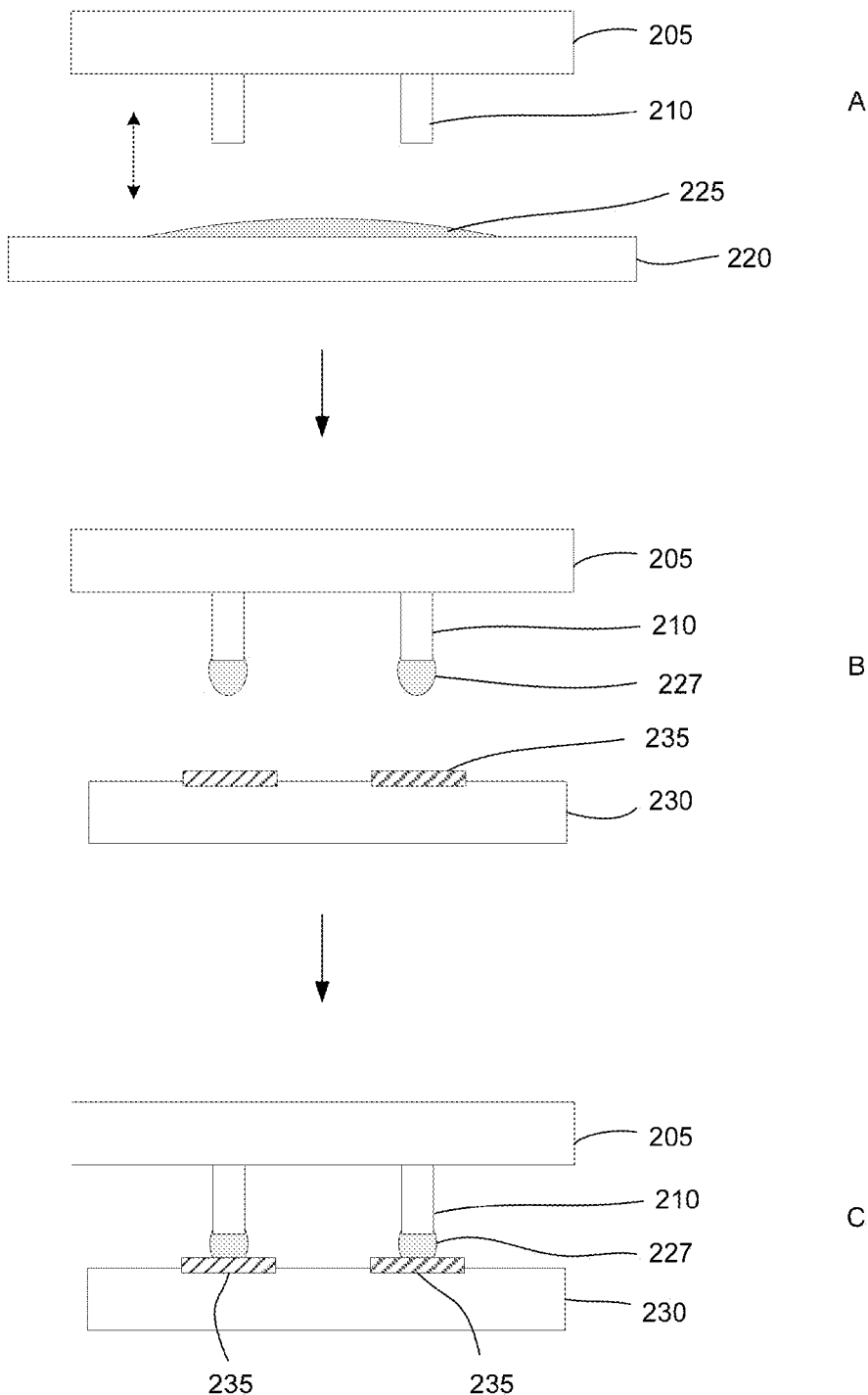
FIGURE 2A-C

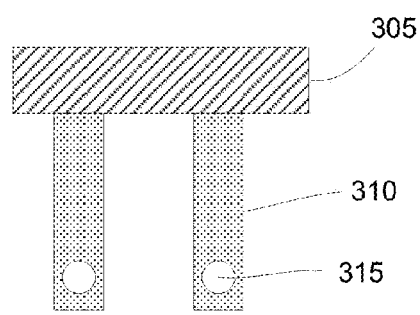
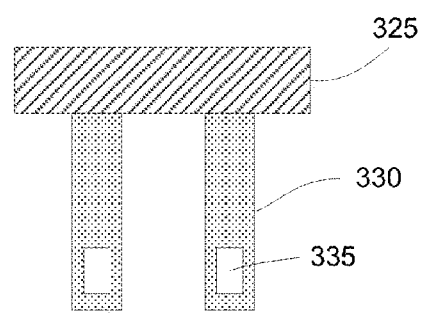
FIGURE 3A
FIGURE 3B

LIQUID METAL INTERCONNECTS

BACKGROUND OF THE INVENTION

Field of the Invention

The embodiments of the invention relate generally to integrated circuit devices, and more specifically to testing and validation of semiconductor chips, testing systems for semiconductor chips, liquid metal interconnects, and liquid metal alloys.

Background Information

The push for ever-smaller integrated circuits (IC) places enormous performance demands on the techniques and materials used to construct and test IC devices. In general, an integrated circuit chip is also known as a microchip, a silicon chip, a chip, or a die. IC chips are found in a variety of common devices, such as the microprocessors in computers, cars, televisions, CD players, and cellular phones. A plurality of IC chips are typically built on a wafer (for example, a thin silicon disk, having a diameter of 300 mm) and after processing the wafer is diced apart to create individual chips (dies or dice).

As part of the manufacturing process, dies are tested to confirm the functioning of the die and provide feedback for the manufacturing process. Testing complex semiconductor dies under controlled electrical, thermal, and mechanical conditions in a cost-effective manner presents challenges as the size of IC chips shrinks and the number of features associated with an individual chip increases.

BRIEF DESCRIPTION OF THE FIGURES

FIGS. 1A-D illustrate methods for forming electrical connections between a testing interface and a device under test.

FIGS. 2A-C illustrate additional methods for forming electrical connections between a testing interface and a device under test.

FIGS. 3A-B provide schematic diagrams illustrating a cross-sectional view of probes that are useful for testing electronic devices.

DETAILED DESCRIPTION OF THE INVENTION

Figures 4A, 4B:
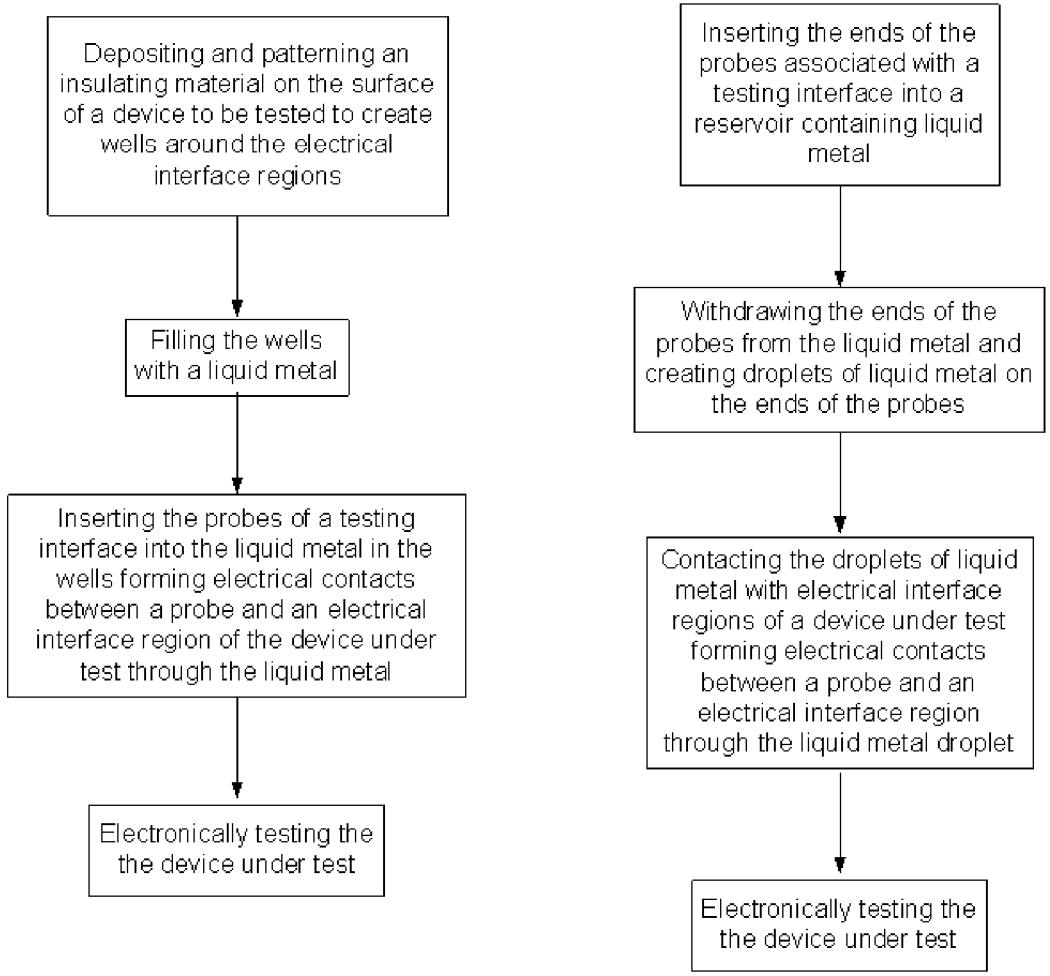
FIGS. 4A-B describe methods for forming electrical connections using liquid metals.

Embodiments of the present invention provide interconnects that are useful for example, for the testing and validation of semiconductor devices. In embodiments of the invention, the interconnects are capable of delivering high currents, such as, currents larger than 1 A, and testing devices presenting interfaces with feature pitches of less than 90 µm. In embodiments of the invention, interconnects are comprised of gallium or liquid metal alloys of gallium. The use of liquid metal contacts does not require that a predetermined amount of force be applied between the testing interface and the device being tested in order to reliably make an electrical connection. By not applying a mechanical force during the formation of electrical connections for chip testing and validation, mechanical stresses on the solid members of the testing and validation system (such as the device under test) can be decoupled.

Embodiments of the invention are useful for high temperature testing and validation ("hot sort") and whole wafer level sort. Hot sort testing is important because certain device failures can be caught at higher temperatures.

FIGS. 1A-D illustrate methods for forming electrical connections between a testing interface and a device under test. The device under test 105 is, for example, a packaged or an unpackaged die, a wafer or portion of a wafer, prepackaged wafer, or any IC interface where a dense array of electrical contacts (e.g., having a pitch of less than 90 µm) needs to be probed. The illustration of the device under test 105 is of a small region of the device that presents two electrical interface regions 110, however, an actual device under test 105, such as a die or a wafer typically comprises a large number of electrical interface regions 110, such as, for example tens of thousands to tens of millions for a die or a wafer, respectively. In the cut-away view of the device under test, electrical interface regions 110 are connected to electronic circuitry (not shown) within the interior of the device under test 105. Other shapes and or sizes are possible for the electrical interface regions 110, and these regions can also be regions, such as, for example, through-silicon vias (TSVs), bumpless build up layers (BBULs), package on package (PoP) contacts, and or contacts associated with other methods of 3-dimensional chip stacking. Embodiments of the invention are not limited to a particular type of electrical interface region for the device under test.

In FIG. 1B, a non-conducting material 115 is deposited on the device under test 105 and patterned. The non-conducting material 115 is, for example, a photoresist material, $SiO_2$, SiN, or SiON, or other insulating material that can be patterned. The patterning of the non-conducting material 115 creates containment regions 120 that are capable of containing a liquid that makes contact with electrical interface regions 110. Deposition and patterning occurs through, for example, standard semiconductor processing techniques. Containment regions 120 are wells or recesses, for example.

In FIG. 1C, a liquid metal 125 is placed in containment regions 120. In embodiments of the invention, the liquid metal 125 is gallium metal or an alloy of gallium metal, such as, for example, alloys of gallium and indium, eutectic alloys of gallium, indium, and tin, and eutectic alloys of gallium, indium, and zinc. In general the liquid metal is a metal or metal alloy that is liquid at the deposition and measurement temperature. The liquid metal 125 is capable of making electrical contact with the proximate electrical interface region 110. In embodiments of the invention, the liquid metal 125 is applied to the device under test 105 of FIG. 1B as a liquid metal particle emulsion. A liquid metal particle emulsion is a mixture of metal micro-particles and a solvent, solvents, or a solvent or solvents and one or more surfactants. In embodiments of the invention, the solvent is a liquid alkane, alcohol, polyether, or polyol. The solvent is liquid under deposition temperatures. The solvent is, for example, hexane, isopropyl alcohol, hexadecane with a surfactant, such as, oleylamine, Triton (non-ionic surfactant commercially available from Dow Chemical Co.), hexadecyl trimethyl ammonium bromide (HTAB), polyoxyethylene 2-oleylether; dimethyl formamide with a surfactant, such as, 1,10 decane dicarboxylic acid, dioctyl phosphate with a surfactant, such as, sulfosuccinate, dipoly ethylene glycol p-nonyl phenyl phosphate with a surfactant, such as, sulfosuccinate, and mixtures thereof. In embodiments of the invention, the liquid metal particle and solvent mixture is created by sonicating the liquid metal in the solvent until a colloidal micro-particle mixture is created. In embodiments of the invention, the colloidal mixture is comprised of liquid metal micro-particles having diameters of less than 100 µm. In additional embodiments of the invention the liquid metal micro-particles exhibit an average diameter of between 4 and 55 um or between 4 and 15 µm. Liquid metal particle emulsions according to embodiment of the invention were found to be capable of reliably filling well regions having a pitch of less than 40 µm. In embodiments of the invention, the liquid metal particle emulsion is converted into a paste-like substance, which contains mainly the liquid metal (e.g., the liquid metal particle emulsion comprises 70 to 90% liquid metal and less than 20% solvent) through, for example, a gravity-driven settling process or through centrifugation. However, in alternate embodiments of the invention, no solvent (or solvent-surfactant mixture) is used in the liquid metal.

The liquid metal 125 fills the regions 120. The liquid metal mixture or liquid metal itself is applied to the surface of the device under test 105 and excess liquid metal (the material remaining above the containment regions 120) is removed. The excess liquid metal can be removed, for example, by using a squeegee to wipe the surface of the non-conducting material 115. Any solvent used in the liquid metal is removed, for example, by evaporation.

In FIG. 1D, a testing interface 130 comprising probes 135 is aligned with the device under test 105 and the probes are touched down into the liquid metal 125 in containment regions 120. The testing interface 130 can also be called a probe card or a sort interface unit. The testing interface 130 is shown in FIG. 1D as having two probes 135 for simplicity of illustration, however, a typical testing interface comprises a large number of probes for forming electrical connections with electrical interface regions presented by devices to be tested. Other shapes are also possible for the probes 135 and the invention is not limited to a particular probe design. The probes 135 are capable of making an electrical connection with the liquid metal region 125 which is capable of making an electrical connection with the proximate electrical interface region 110. An electrical connection between the testing interface 130 and the electrical interface region 110 is formed through the liquid metal region 125. Advantageously, no pressure needs to be applied to the device under test 105 in order to make the electrical connection with the testing interface 130. The device under test 105 is then electronically tested and the testing interface 130 is moved away from the device under test 105.

Although the probes associated with testing interfaces typically have spring-like mechanisms in order to regulate the amount of pressure applied to a device under test, in embodiments of the invention, no spring-like mechanisms are necessary and the probes 135 used for testing can be non-flexing members. However, flexible probes can also be used in embodiments of the invention. In embodiment of the invention probes 135 are comprised of a conducting material, such as, W, NiW, NiMn, NiCo, Rh, Cu, BeCu, Paliney 7 (a palladium alloy comprising, silver, gold, copper, platinum, and zinc), Au, Ag, Pd, nanocarbon composites, metal coated silicon, and or other metals, metal alloys, and composites. Testing of electronic devices can be done at a variety of temperatures, such as for example low temperature, such as −10° C. to 0° C., room temperature, and high temperature, such as 90° C. to 100° C., or other temperatures commonly used to test electronic devices after manufacture. It was demonstrated that a 20-50 µm liquid metal (such as gallium alloy) bridge can carry currents of at least 2 A.

After testing is completed, the testing interface 130 is moved away from the device under test 105. The liquid metal 125 is removed and the non-conducting material 115 is also optionally selectively removed. The resulting structure, after the removal of both the liquid metal 125 and the non-conducting material 115 is the structure shown in FIG. 1A. Liquid metal 125 can be removed, for example, through the use of solvent-based or acid-based wet methods, sonication, and or dry physical methods, such as, for example, excimer lasers. The non-conducting material 115 is removed through standard semiconductor processing techniques depending on the composition of the layer. In alternate embodiments, the non-conducting material 115 is left in place and serves, for example, as a solder resist opening or a buffer coat layer.

FIGS. 2A-C illustrate additional methods for forming electrical connections between a testing interface and a device under test. In FIG. 2A, a testing interface 205 has probes 210. The testing interface 205 can also be called a probe card or a sort interface unit. The testing interface 205 is shown in FIG. 2A as having two probes 210 for simplicity, however, a typical testing interface comprises a large number of probes for forming electrical connections with electrical interface regions presented by devices to be tested. Other shapes are also possible for the probes 210 and the invention is not limited to a particular probe design. The testing interface 205 is aligned with one or more reservoirs 220 that contain liquid metal 225. In embodiments of the invention, the liquid metal 225 is gallium metal or an alloy of gallium metal, such as, for example, alloys of gallium and indium, eutectic alloys of gallium, indium and tin, and eutectic alloys of gallium, indium, and zinc. In general the liquid metal is a metal or metal alloy that is liquid at the deposition and measurement temperature. In embodiments of the invention, the liquid metal 225 is a liquid metal particle emulsion. A liquid metal particle emulsion is a mixture of metal micro-particles and a solvent, solvents, or a solvent or solvents and one or more surfactants. In embodiments of the invention, the solvent is a liquid alkane, alcohol, polyether, or polyol. The solvent is liquid under deposition temperatures. The solvent is, for example, hexane, isopropyl alcohol, hexadecane with a surfactant, such as, oleylamine, Triton (non-ionic surfactant commercially available from Dow Chemical Co.), hexadecyl trimethyl ammonium bromide (HTAB), polyoxyethylene 2-oleylether; dimethyl formamide with a surfactant, such as, 1,10 decane dicarboxylic acid, dioctyl phosphate with a surfactant, such as, sulfosuccinate, dipoly ethylene glycol p-nonyl phenyl phosphate with a surfactant, such as, sulfosuccinate, or mixtures thereof. In embodiments of the invention, the liquid metal particle and solvent mixture is created by sonicating the liquid metal in the solvent until a colloidal mixture is created. In embodiments of the invention, the colloidal mixture is comprised of liquid metal micro-particles having diameters of less than 100 µm. In additional embodiments of the invention the liquid metal micro-particles exhibit an average diameter of between 4 and 55 um or between 4 and 15 µm. In embodiments of the invention, the liquid metal particle emulsion is converted into a paste-like substance, which contains mainly the liquid metal (e.g., the liquid metal particle emulsion comprises 70 to 90% liquid metal and less than 20% solvent) through, for example, a gravity-driven settling process or through centrifugation. However, in alternate embodiments of the invention, no solvent (or solvent and surfactant mixture) is used in the liquid metal 225.

The testing interface 205 is translated toward the one or more reservoirs 220 that contain liquid metal 225. The ends of the probes 210 of the testing interface 205 are partially immersed in the liquid metal 225. The testing interface is then translated away from the one or more reservoirs 220 forming droplets 227 of liquid metal 225 (shown in FIG. 2B) on the ends of probes 210. Any solvent used in the liquid metal 227 is evaporated.

In FIG. 2B, the testing interface 205 is moved into position above a device under test 230 and the probes 210 are aligned with electrical interface regions 235 of the device under test 230. The device under test 230 is, for example, a packaged or an unpackaged die, a wafer or portion of a wafer, prepackaged wafer, or any other dense array of electrical contacts (e.g., having a pitch of less than 90 µm) that needs to be probed. The illustration of the device under test 230 is of a small region of the device that presents two electrical interface regions 235, however, an actual device under test 230, such as a die or a wafer typically comprises a large number of electrical interface regions 235, such as, for example tens of thousands or tens of millions for a die or a wafer, respectively. In the cut-away view of the device under test, electrical interface regions 235 are connected to electronic circuitry (not shown) within the interior of the device under test 230. Other shapes and or sizes are possible for the electrical interface regions 235, and these regions might also be regions, such as, for example, through-silicon vias (TSVs), bumpless build up layers (BBULs), package on package (PoP) contacts, and or contacts associated with other methods of 3-dimensional chip stacking. As mentioned previously, embodiments of the invention are not limited to a particular type of electrical interface region for the device under test.

In FIG. 2C, the testing interface 205 is translated toward the device under test 230 until each droplet 227 makes contact with an electrical interface region 235. An electrical connection between the testing interface 205 and the electrical interface region 235 is formed through the liquid metal droplet 227. Advantageously, no pressure needs to be applied to the device under test 230 in order to make an electrical connection with the probes 210 of testing interface 205. The device under test 230 is then electronically tested and the testing interface 205 is moved away from the device under test 230.

Although the probes associated with testing interfaces typically have spring-like mechanisms in order to regulate the amount of pressure applied to a device under test, in embodiments of the invention, no spring-like mechanisms are necessary and the probes 210 used for testing can be non-flexing members. In embodiment of the invention probes 210 are comprised of a conducting material, such as, W, NiW, NiMn, NiCo, Rh, Cu, BeCu, Paliney 7 (a palladium alloy comprising, silver, gold, copper, platinum, and zinc), Au, Ag, Pd, nanocarbon composites, metal coated silicon, and or other metals, metal alloys, and composites. However, flexible probes can also be used in embodiments of the invention. Testing of electronic devices can be done at a variety of temperatures, such as for example low temperature, such as −10° C. to 0° C., room temperature, and high temperature, such as 90° C. to 100° C., or other temperatures commonly used to test electronic devices after manufacture.

The testing interface 205 is then translated away from the device under test 230. The surface of the device under test 230 is optionally cleaned. Any residual liquid metal 227/225 remaining on the device under test 230 can be removed, for example, through the use of solvent-based or acid-based wet methods, sonication, and or dry physical methods, such as, for example, excimer lasers. In an embodiment of the invention, liquid metal 227 is removed from the ends of the probes 210 and the process of FIGS. 2A-C is repeated to probe a second device under test. As mentioned above, liquid metal 227 can be removed, for example, through the use of solvent-based or acid-based wet methods, sonication, and or dry physical methods, such as, for example, excimer lasers. The liquid metal 227 can be removed, for example, by sonicating the tips of the probes 210 in a solvent, such as isopropyl alcohol. In alternate embodiments, the liquid metal 227 on the tips of the probes 210 is not removed and the process of FIGS. 2A-C is repeated to probe a second electronic device. In further alternate embodiments, the liquid metal 227 on the tips of the probes 210 is not removed and the testing interface 205 is translated into position above a second device under test (not shown) and the second device under test is electronically tested. In embodiments of the invention, the liquid metal 227 on the tips of the probes 210 may be cleaned after testing a certain number of devices and the process of FIGS. 2A-C repeated.

FIGS. 3A-B provide probe designs that are useful in embodiments of the invention. In FIG. 3A, a testing interface 305 comprises probes 310. Probes 310 have through-holes 315 having a circular aspect. In FIG. 3B testing interface 325 comprises probes 330. Probes 330 have through-holes 335 having a rectangular aspect. In FIGS. 3A-B, the testing interfaces 305 and 325 can also be called a probe card or a sort interface unit. The testing interfaces 303 and 325 are shown as having two probes 310 and 330 for simplicity, however, a typical testing interface comprises a large number of probes for forming electrical connections with electrical interface regions presented by devices to be tested. Other shapes are also possible for the probes 310 and 330. In embodiments of the invention, probes 310 and 330 are comprised of a conducting material, such as, W, NiW, NiMn, NiCo, Rh, Cu, BeCu, Paliney 7 (a palladium alloy comprising, silver, gold, copper, platinum, and zinc), Au, Ag, Pd, nanocarbon composites, metal coated silicon, and or other metals, metal alloys, and composites. Probes having through-holes are useful, for example, in embodiments of the invention in which the probes are partially immersed in liquid metal and liquid metal droplets adhere to the ends of the probes when the probes are pulled from the liquid metal, such as those described with respect to FIGS. 2A-C. In general, probes used in embodiments of the invention employing liquid metal to form electrical contacts do not need to be as strong as probes used in applications where a pressure is exerted between the device under test and the testing interface. In embodiments of the invention, probes exhibit low resistance and heat tolerance at micrometer pitches.

FIGS. 4A-B describe methods for forming electrical connections using liquid metals. In FIG. 4A, an insulating material is deposited on a device to be tested and patterned. The device to be tested is an integrated circuit chip or a wafer comprising a plurality of integrated circuit chips, as described more fully herein. The patterning creates wells around the electrical interface regions of the device under test. The wells are filled with a metal or metal alloy that is liquid at the deposition and measurement temperatures. In embodiments of the invention, the liquid metal comprises gallium or alloys of gallium. The probes of a testing interface are inserted into the liquid metal in the wells. A plurality of probes are used and aligned with the plurality of electrical interface regions to be probed and present on the device under test and one probe makes electrical contact with one electrical interface on the device. The probes make electrical contact with the electrical interface regions through the liquid metal. The device under test is then electronically tested using a computer system attached to the testing interface. As described herein, the testing interface is then translated away and the surface of the device under test is then cleaned to remove the liquid metal and optionally the patterned insulating layer.

In FIG. 4B, the ends of the probes of a testing interface are inserted into a reservoir containing a liquid metal. The liquid metal is a metal or metal alloy that is liquid at the deposition and measurement temperatures. In embodiments of the invention, the liquid metal comprises gallium or alloys of gallium. The probes are removed from the liquid metal creating droplets of liquid metal on the ends of the probes. The droplets of liquid metal are contacted with the electrical interface regions of a device under test. A plurality of probes are used and aligned with the plurality of electrical interface regions present on the device under test and one probe makes electrical contact with one electrical interface on the chip. The probes make electrical contact with the electrical interface regions through the liquid metal droplets. The device under test is then electronically tested using a computer system attached to the testing interface. As described herein, the testing interface is then translated away and the surface of the device under test is then cleaned to remove the liquid metal.

In general, a testing interface is an interface between a device to be tested and a computing system. The computing system comprises a testing component capable of directing the electronic testing of semiconductor devices such as integrated circuit chips and or wafers comprising integrated circuit chips. The testing component may have combinations of hardware components and software components. In some cases, the connection of one component to another may be a close connection where two or more components are operating on a single hardware platform. In other cases, the connections may be made over network connections spanning long distances.

A computer includes a processing system, including a processor that is communicatively coupled to one or more volatile or non-volatile data storage devices, such as random access memory (RAM), read-only memory (ROM), mass storage devices such as serial advanced technology attachment (SATA) or small computer system interface (SCSI) hard drives, and or devices capable of accessing media, such as floppy disks, optical storage, tapes, flash memory, memory sticks, CD-ROMs and or digital video disks (DVDs). The term ROM refers to non-volatile memory devices such as erasable programmable ROM (EPROM), electrically erasable programmable ROM (EEPROM), flash ROM, and or flash memory. The processor may also be communicatively coupled to additional components, such as video controllers, SCSI controllers, network controllers, universal serial bus (USB) controllers, devices capable of supply data and other inputs, and user input devices, such as keyboards, touch pads, touch screens, joysticks, and mice. Communications between elements of the computer system, additional processors, and or the electrical usage monitors can occur using various wired and or wireless short range protocols including, USB, WLAN (wireless local area network), radio frequency (RF), satellite, microwave, Institute of Electrical and Electronics Engineers (IEEE) 802.11, Bluetooth, optical, fiber optical, infrared, cables, and lasers.

Persons skilled in the relevant art appreciate that modifications and variations are possible throughout the disclosure as are combinations of and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and or structures may be included and or described features may be omitted in other embodiments.

We claim:

1. A method for testing a die, the method comprising:
providing a die to be tested comprising a surface, wherein the surface comprises an insulating material disposed thereon and electrical interface regions to be used for testing, and wherein the insulating material comprises wells wherein the electrical interface regions are each located in a well;
placing a liquid metal into the wells on the die to be tested;
forming an electrical connection between probes of a testing interface and the electrical interface regions by contacting the probes of the testing interface with the liquid metal that is in the wells on the die to be tested; and
electrically testing the die to be tested after forming the electrical connection between the probes of the testing interface and the electrical interface regions.

2. The method of claim 1 wherein the insulating material is a photoresist material.

3. The method of claim 1 wherein the liquid metal is comprised of gallium.

4. The method of claim 1 wherein the liquid metal is an alloy of gallium selected from the group consisting of alloys of gallium and indium, alloys of gallium, indium and tin, and alloys of gallium, indium, and zinc.

5. The method of claim 1 wherein the liquid metal is a liquid metal emulsion.

6. The method of claim 1 wherein the liquid metal is a liquid metal emulsion and the solvent is selected from the group consisting of liquid alkanes, liquid alcohols, liquid polyethers, and liquid polyols.

7. The method of claim 1 wherein the liquid metal is a liquid metal emulsion having metal micro-particles with an average diameter between 4 μm and 100 μm.

8. The method of claim 1 wherein forming an electrical connection between probes of a testing interface and the electrical interface regions occurs without the application of pressure between the testing interface and the die to be tested.

9. The method of claim 1 wherein electronically testing occurs through a computer operably connected to the testing interface.

10. The method of claim 7 also including removing the liquid metal and photoresist material from the die to be tested after electronically testing the die to be tested.

11. The method of claim 1 also including removing the liquid metal and the insulating material.

12. The method of claim 1, wherein the die to be tested is a packaged die.

13. The method of claim 1, wherein the die to be tested is a portion of a wafer.

* * * * *